June 11, 1963 F. W. WATLINGTON 3,093,809
AUTOMATICALLY KEYED SIGNAL SOURCE
Filed July 8, 1960
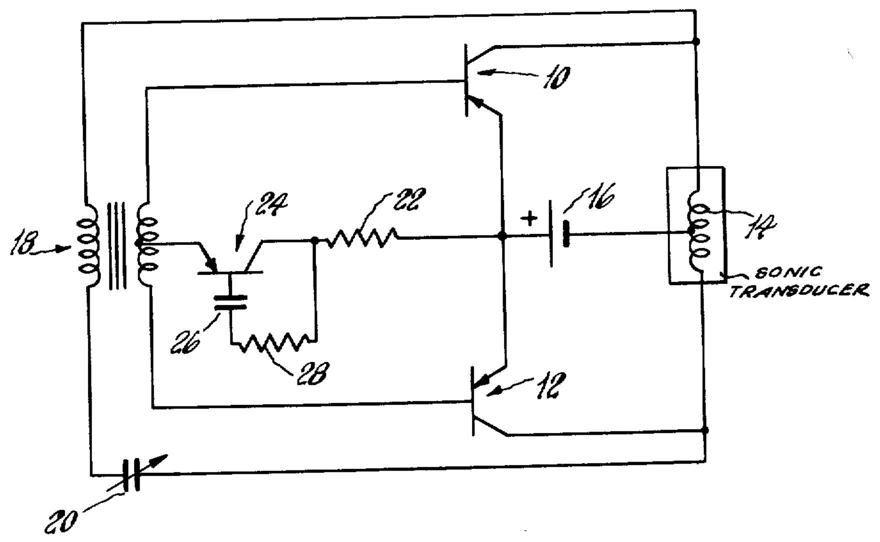
INVENTOR.
FRANCIS W. WATLINGTON
BY Philip Schneider
ATTORNEY United States Patent Office 3,093,809
Patented June 11, 1963

3,093,809
AUTOMATICALLY KEYED SIGNAL SOURCE

Francis W. Watlington, Coralita Pembroke, Bermuda, assignor to the United States of America Filed July 8, 1960, Ser. No. 41,709
9 Claims. (Cl. 340—15)

This invention relates to an automatically keyed signal source and especially to a self-pulsed signal source for underwater operation.

In underwater work, marking the positon of objects is a difficult problem, especially when the objects are not fixed but drift with the ocean currents. A modern method of accomplishing such location marking is to affix a small signal source to the object, the location of the object then being ascertainable by means of signal-finding techniques. The oscillator may be of the continuously operable type or may be operable in response to a signal from a remote location. A type of signal source which is frequently employed utilizes an oscillator driving conventional amplifier stages and a sound transducer, the oscillator being keyed by a pulsed relay.

In electronic equipment, in general, it is desirable to reduce the number of components used since this results in a savings of space, initial cost, cost of repairs and maintenance and usually a lesser need for repairs and maintenance. This last desideratum is especially desirable in underwater work. The present invention provides a simlified, self-pulsed signal source which requires fewer components than the signal sources presently employed.

The objects and advantages of the present invention are accomplished by means of two transistors combined in a push-pull amplifier circuit feeding a sonic transducer, the transistor circuit being made to oscillate by feeding back some of the output to the input through a condenser and a transformer. Self-pulsing is effected by connecting a simple transistor relaxation oscillator between the mid-point of the input transformer secondary winding and the emitter circuit of the oscillator transistors.

An object of this invention is to provide a stable self-pulsed signal.

Another object is to provide a self-pulsed sonic signal.

A further object is to provide a self-pulsed, sonic signal source in which the power output is limited only by the power capabilities of the transistors.

Other objects and many of the attendant advantages of this invention will be readily appreciated as the same becomes better understood by reference to the following detailed description when considered in connection with the accompanying drawing wherein the FIGURE is a circuit diagram of a preferred embodiment of the invention.

The drawing illustrates an embodiment of the invention in which a pair of transistors 10 and 12 are connected in a push-pull amplifier arrangement. A sonic transducer 14 is connected between the collector elements of the transistors 10 and 12. A source of supply voltage 16 is connected between the center tap of the transducer 14 and the emitter elements of the transistors 10 and 12. The output of the transistors 10 and 12 is fed back through a feedback, or driver, transformer 18 to the bases of the transistors 10 and 12, the output of one transistor, in this case transistor 12, being applied to one side of the primary of the transformer 18 through a tuning capacitor 20.

The emitters of the transistors 10 and 12 are connected through a base biasing resistor 22 to the mid-point of the secondary of the driver transformer 18 through a relaxation oscillator comprising a switching transistor 24, a pulsing resistor 26 and a pulsing capacitor 28. The mid-point of the secondary of the driver transformer 18 is connected to the emitter element of the switching transistor 24, the collector element being connected to the biasing resistor 22. The pulsing capacitor 26 and the pulsing resistor 28 are connected in series between the base element of the switching transistor 24 and the collector element.

The sonic transducer 14 is of the magneto-striction type since the low impedance characteristic of this transducer considerably simplifies the circuit. Of course, other types of sonic transducer could be employed; for example, the crystal type could be used with a transformer to change its impedance to the proper matching value.

The transducers employed are of the P-N-P type although the N-P-N type can also be used.

If the base biasing resistor 22 were connected directly to the mid-point of the secondary side of the driver transformer 18, and the relaxation oscillator circuit were omitted, the circuit would be a push-pull amplifier in which positive feedback to the input causes continuous oscillation at the resonant frequency of the magnetostriction transducer 14. The size of the tuning capacitor 20 must be such that the phase of the feedback signal at the bases of the oscillator transistors 10 and 12 will sustain oscillations at the resonant frequency of the magnetostriction transducer 14. Thus, for this configuration, the circuit would oscillate continuously at maximum output and at a frequency determined by the transducer 14 and the condenser 20.

The addition of the relaxation oscillator circuit operates to pulse the main oscillator. A voltage is developed across the switching transistor 24 from its base to its collector element. This voltage charges condenser 26 through resistor 28. When the charge across the condenser 26 reaches a high enough value, the conduction of the switching transistor 24 is either cut off or greatly reduced, so that a high impedance is presented in the base-emitter circuit of oscillator transistors 10 and 12. This reduces the oscillation of these transistors 10 and 12 to zero or to a very low value. When a sufficient amount of charge leaks off the pulsing condensers 26, the switching transistor 24 again begins to conduct and the circuit again breaks into oscillation. The pulsing rate depends on the speed at which the charge leaks off the pulsing condenser 26; this rate can be increased by placing a suitable resistor in parallel with the pulsing condenser 26.

The end of the pulsing resistor 28 which is now connected to the collector of the switching transistor 24 may also be connected to the emitters of the oscillator transistors 10 and 12 or to the negative side of the supply source 16.

The values of typical components which may be employed to produce a 12 kilocycle pulsed signal are as follows:

| | |
|---|---|
| Oscillator and switching transistors | Type 2N68. |
| Magnetostriction transducer | 12 kilocycles. |
| Pulsing capacitor | 20 mfd. |
| Pulsing resistor | 2200 ohms. |
| Biasing resistor | 47 ohms. |
| Biasing source | 12-volt battery. |
| Tuning capacitor | 0.1 mfd. |

Obviously many modifications and variations of the present invention are possible in the light of the above teachings. It is therefore to be understood that within the scope of the appended claims the invention may be practiced otherwise than as specifically described.

I claim:

1. An automatically keyed, sonic-signal source comprising, in combination: a pair of transistors, a sonic transducer and connections for a source of supply voltage for said transistors, said transducer, transistors and supply voltage connections being arranged to form a push-pull amplifier the output of which is applied to said transducer; feedback means connected to said push-pull amplifier to provide sufficient positive feedback to cause said amplifier to oscillate; tuning means connected in the feedback path for tuning the frequency of oscillation of said amplifier to the resonant frequency of said transducer; and switching means connected to said amplifier for automatically interrupting said oscillations at a predetermined rate.

2. An automatically keyed, sonic-signal source comprising, in combination: a pair of transistors, each having at least an emitter, collector and base element, said emitters being connected together; sonic transducer means connected between the collector elements of said transistors; connections for a source of supply voltage for said transistors, said connections being connected between said sonic transducer means and the emitters of said transistors; feedback means connected between the collector of each said transistor and its base, said feedback means providing sufficient positive feedback between the output and input of each transistor to cause said transistors to oscillate; tuning means connected in the feedback path of at least one transistor for enabling the frequency of oscillation of said transistors to be tuned to the resonant frequency of said sonic transducer means; and switching means connected between the emitters and the bases of said transistors for automatically cutting off oscillation of said transistors at a predetermined rate.

3. An automatically keyed sonic-signal source comprising, in combination: a pair of transistors, each having at least an emitter, collector and base element, said emitters being connected together; sonic transducer means connected between the collector elements of said transistors; connections for a source of supply voltage for said transistors, said supply connections being connected between said sonic transducer means and the emitters of said transistors; feedback means connected between the collector of each said transistor and its base, said feedback means providing sufficient positive feedback between the output and input of each transistor to cause said transistors to oscillate continuously; tuning means connected in the fedeback path of at least one transistor for enabling the frequency of oscillation of said transistors to be tuned to the resonant frequency of said sonic transducer means; and transistor switching means connected between the emitters and the bases of said transistors for automatically cutting off oscillation of said transistors at a predetermined rate.

4. An automatically keyed sonic-signal source comprising, in combination: a pair of transistors, each having at least an emitter, collector and base element, said emitters being connected together; sonic transducer means connected between the collector elements of said transistors; connections for a source of supply voltage for said transistors, said supply connections being connected between said sonic transducer means and the emitters of said transistors; feedback means connected between the collector of each said transistor and its base, said feedback means providing sufficient positive feedback between the output and input of each transistor to cause said transistors to oscillate continuously; tuning means connected in the feedback path of at least one transistor for enabling the frequency of oscillation of said transistors to be tuned to the resonant frequency of said sonic transducer means; and a relaxation oscillator connected between the emitters and the bases of said transistors for automatically cutting off oscillation of said transistors at a predetermined rate.

5. An automatically keyed sonic-signal source comprising, in combination: a pair of transistors, each having at least an emitter, collector and base element, said emitters being connected together; sonic transducer means connected between the collector elements of said transistors; connections for a source of supply voltage for said transistors, said supply connections being connected between said sonic transducer means and the emitters of said transistors; feedback means connected between the collector of each said transistor and its base, said feedback means providing sufficient positive feedback between the output and input of each transistor to cause said transistors to oscillate continuously; tuning means connected in the feedback path of at least one transistor for enabling the frequency of oscillation of said transistors to be tuned to the resonant frequency of said sonic transducer means; and a transistor relaxation oscillator connected between the emitters and the bases of said transistors for automatically cutting off oscillation of said transistors at a predetermined rate.

6. An automatically keyed, sonic-signal source comprising, in combination: a pair of transistors, each having at least an emitter, collector and base element, said emitters being connected together; a magnetostriction transducer connected between the collector elements of said transistors; connections for a source of supply voltage for said transistors, said connections being connected between said sonic transducer means and the emitters of said transistors; feedback means connected between the collector of each said transistor and its base, said feedback means providing sufficient positive feedback between the output and input of each transistor to cause said transistors to oscillate; tuning means connected in the feedback path of at least one transistor for enabling the frequency of oscillation of said transistors to be tuned to the resonant frequency of said transducer means; and switching means connected between the emitters and the bases of said transistors for automatically cutting off oscillation of said transistors at a predetermined rate.

7. An automatically keyed, sonic-signal source comprising, in combination: a pair of transistors, each having at least an emitter, collector and base element, said emitters being connected together; sonic transducer means connected between the collector elements of said transistors; connections for a source of supply voltage for said transistors, said connections being connected between said sonic transducer means and the emitters of said transistors; a transformer for providing sufficient positive feedback between the output and input of each transistor to cause said transistors to oscillate, the primary winding of said transformer being connected between the collector elements, and the secondary winding between the base elements, of said transistors; tuning means connected in the feedback path of at least one transistor for enabling the frequency of oscillation of said transistors to be tuned to the resonant frequency of said sonic transducer means; and switching means connected between the emitters and the bases of said transistors for automatically cutting off oscillation of said transistors at a predetermined rate.

8. An automatically keyed, sonic-signal source comprising, in combination: a pair of transistors, each having at least an emitter, collector and base element, said emitters being connected together; a magnetostriction transducer connected between the collector elements of said transistors; connections for a source of supply voltage for said transistors, said connections being connected between said magnetostriction transducer and the emitters of said transistors; a transformer for providing sufficient positive feedback between the output and input of each transistor to cause said transistors to oscillate, the primary winding of said transformer being connected between the collector elements, and the secondary winding between the base elements, of said transistors; a capacitance connected in the feedback path of at least one transistor, said capacitance being of such value that the frequency of oscillation of said transistors corresponds to the resonant frequency of said magnetostriction transducer; a base-biasing resistance; and a relaxation oscillator connected in series with said base-biasing resistance between the emitters and the bases of said transistors for automatically cutting off oscillation of said transistors at a predetermined rate.

9. A device as set forth in claim 8, wherein said relaxation oscillator comprises a transistor having a base, a collector and an emitter element, a capacitance and a resistance, the emitter element being connected to the midpoint of the secondary winding of said transformer, the collector element being connected to said base-biasing resistance, and the capacitance and resistance being connected in series between the base and collector elements of said relaxation oscillator transistor.

References Cited in the file of this patent

UNITED STATES PATENTS

| | | |
|---|---|---|
| 1,865,428 | Bethenod | July 2, 1932 |
| 2,498,990 | Fryklund | Feb. 28, 1950 |
| 2,576,585 | Fleming | Nov. 27, 1951 |
| 2,910,688 | Kelly et al. | Oct. 27, 1959 |
| 2,910,689 | Grace | Oct. 27, 1959 |